(12) United States Patent
Morrison et al.

(10) Patent No.: US 11,342,103 B2
(45) Date of Patent: May 24, 2022

(54) ELECTRO-PERMANENT MAGNET THERMAL PROTECTION

(71) Applicant: Dell Products L.P., Round Rock, TX (US)

(72) Inventors: Jason S. Morrison, Chadron, NE (US); Mark A. Casparian, Miami, FL (US)

(73) Assignee: Dell Products L.P., Round Rock, TX (US)

( * ) Notice: Subject to any disclaimer, the term of this patent is extended or adjusted under 35 U.S.C. 154(b) by 224 days.

(21) Appl. No.: 16/916,426

(22) Filed: Jun. 30, 2020

(65) Prior Publication Data

US 2021/0407718 A1    Dec. 30, 2021

(51) Int. Cl.
| | | |
|---|---|---|
| H01F 13/00 | (2006.01) | |
| H01F 7/06 | (2006.01) | |
| H01F 7/18 | (2006.01) | |
| H01H 13/785 | (2006.01) | |
| H05K 7/20 | (2006.01) | |

(52) U.S. Cl.
CPC ........... *H01F 7/064* (2013.01); *H01F 7/1811* (2013.01); *H01F 13/006* (2013.01); *H01H 13/785* (2013.01); *H05K 7/20136* (2013.01)

(58) Field of Classification Search
CPC .................................. H01F 7/04; H01F 13/006
See application file for complete search history.

(56) References Cited

U.S. PATENT DOCUMENTS

| | | |
|---|---|---|
| 8,497,613 B2 | 7/2013 | Nakamura |
| 10,408,796 B2 | 9/2019 | Bondurant et al. |
| 2017/0301441 A1 | 10/2017 | Gray et al. |
| 2019/0385774 A1 | 12/2019 | Denham et al. |
| 2021/0043347 A1 | 2/2021 | Chossat et al. |

*Primary Examiner* — Ramon M Barrera
(74) *Attorney, Agent, or Firm* — Zagorin Cave LLP; Robert W. Holland

(57) ABSTRACT

De-magnetization protection is provided for electro-permanent magnets during information handling system manufacture and use by monitoring thermal conditions at the information handling systems to detect a thermal state associated with de-magnetization and commanding the electro-permanent magnets to an off state so that both magnets in the electro-permanent magnet have opposing polarities. The opposing polarities tend to stabilize magnet polarity to prevent de-magnetization during increased temperatures. Normal operations are then re-enabled once temperatures decrease.

20 Claims, 3 Drawing Sheets

ELECTRO-PERMANENT MAGNET THERMAL PROTECTION

BACKGROUND OF THE INVENTION

Field of the Invention

The present invention relates in general to the field of information handling systems that include electro-permanent magnets, and more particularly to electro-permanent magnet thermal protection.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems typically accept end user inputs through a keyboard. Portable information handling systems generally integrate a keyboard in a portable housing to support end user inputs while mobile. Both portable and desktop information handling systems also can accept inputs for a peripheral keyboard, such as through a cable or wireless interface. A typical keyboard includes a large number of internal parts designed to accept key presses, record the end user input and return the keys to a biased up position. Keyboards need robust designs to withstand years of repeated key inputs with a repeatable feel at the keys.

One approach for managing keyboard key positions is to use magnets to attract and repel each other. For instance common magnet polarities facing each other (north versus north or south versus south) between a circuit board and a key can force the key to levitate. Opposing magnet polarities between a circuit board and key (north versus south) can force the key to a retracted position, such as may be convenient for storage and mobility. Magnets may also be used for sensing key position, such as by inducing a current sensed by a Hall sensor. Using magnets to enforce key position and motion can provide an excellent end user experience and a robust solution.

Electro-permanent magnets (EPMs) offer a powerful option for inclusion in keyboards and in other parts of an information handling system. An electro-permanent magnet places first and second magnets of dissimilar material near each other, such as integrated within a component structure, and changes the polarity of one of the magnets with application of current to a coil wrapped around the magnet. For instance, a neodymium magnet is magnetized with a permanent polarity and coupled next to an alnico magnet having a coil wrapped around it. When both magnets have common polarity, the effect is an external magnetic field reinforced by both magnets, essentially an "on" magnetic state. When the magnets have opposing polarities, the magnetic fields attract to each other to reduce any external magnetic field, essentially an "off" magnetic state. Within an information handling system, the electro-permanent magnet is switched between the on and off states by applying current to the coil around the second magnet to switch its polarity.

One difficulty with using electro-permanent magnets is their sensitivity to heat, which can cause de-magnetization. As a result, during manufacture electro-permanent magnet components are typically hand soldered to circuit boards. In some instances, hand soldering can be quite inefficient, such as in a keyboard where over 100 electro-permanent magnet components may be used on a single circuit board. Normally components are automatically placed on the circuit board automatically with a pick and place machine and solder paste, and then heated to couple the components in place when the solder paste cools. Generally, however, the heat of an oven to couple the components to the circuit board can result in de-magnetization of the electro-permanent magnets.

SUMMARY OF THE INVENTION

Therefore, a need has arisen for a system and method which protects electro-permanent magnets from de-magnetization during increased thermal states.

In accordance with the present invention, a system and method are provided which substantially reduce the disadvantages and problems associated with previous methods and systems for using electro-permanent magnets in increased thermal states. A thermal state associated with an electro-permanent magnet is determined and, when a predetermined thermal state exists, the electro-permanent magnet is placed in an off state to protect against de-magnetization.

More specifically, during manufacture of an information handling system circuit board, such as for a keyboard, electro-permanent magnets are switched to an off state having opposing polarization between first and second magnets of the electro-permanent magnet to aid in magnetization stabilization before applying heat to couple the electro-permanent magnets to the circuit board. For instance, the electro-permanent magnets are interfaced with a fixture to apply current that switches the second magnet polarity to oppose the first magnet and then placed on a circuit board with a pick and place machine and heated in an oven. After manufacture once the circuit board cools, the electro-permanent magnet is enabled to select the on state if a sensed thermal state is within a temperature constraint that protects against de-magnetization. For instance, the circuit board is installed in an information handling system and thermal conditions are monitored with a thermal sensor, such as with a de-magnetization protection logic stored in non-transient memory and executed on a processing element, such as a controller of the keyboard or an embedded controller of the information handling system. If a thermal constraint is exceeded, the logic disables the electro-permanent magnet on state until the thermal state is reduced to a level having an acceptable risk that de-magnetization will not occur. In one example embodiment, when the thermal constraint is approached or exceeded additional cooling may be commanded, such as by increasing cooling airflow provided from a cooling fan.

The present invention provides a number of important technical advantages. One example of an important technical advantage is that a circuit board having electro-permanent magnets is manufactured with an automated process, such as with a pick and place machine and oven, while also protected from de-magnetization by switching the electro-permanent magnets to an off state before applying heat. Automated manufacture provides increased manufacture efficiency and allows electro-permanent magnets to be incorporated in a variety of information handling system circuit boards, such as keyboards, motherboards and storage components. In addition, thermal condition monitoring at an information handling system aids in protection against de-magnetization by commanding electro-permanent magnets to an off state when a thermal constraint is reached and returning the electro-permanent magnets to normal operations when the thermal constraint is resolved, thus preventing electro-permanent magnet failure during normal operations of a system in the field.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

An electro-permanent magnet associated with an information handling system is protected from de-magnetization by adjusting to an off state during predetermined thermal conditions. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
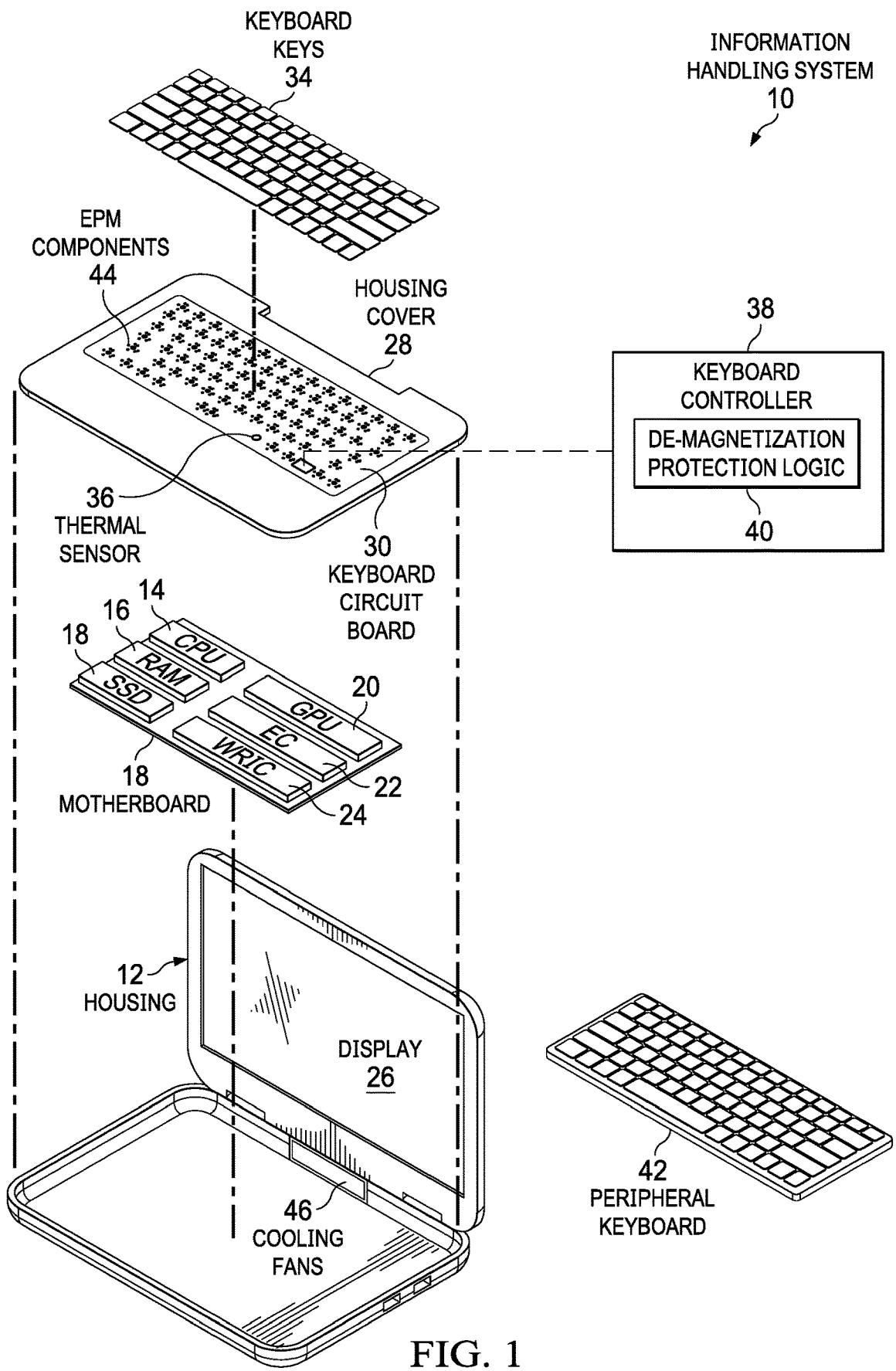
FIG. 1 depicts an exploded view of an information handling system that includes electro-permanent magnets.

Referring now to FIG. 1, an exploded view depicts an information handling system 10 that includes electro-permanent magnet components 44. In the example embodiment, information handling system 10 processes information with processing components disposed in a portable housing 12. For example, housing 12 has a base portion that contains a central processing unit (CPU) 14 that executes instructions to process information in cooperation with a random access memory (RAM) 16 that stores the instructions and information. A solid state drive (SSD) 18 provides non-transient memory that stores the information and instructions during power off periods, such as an operating system and applications that are retrieved to RAM 16 at system start. A graphics processing unit (GPU) 20 interfaces with CPU 14 and processes information to generate pixel values that define visual images for presentation at a display 26 integrated in a lid portion of housing 12. An embedded controller 22 manages operation of processing components, such as application and control of power and management of thermal conditions with a cooling fan 46 that provides a cooling airflow. Embedded controller 22 also supports interactions with input devices, such as an integrated keyboard or a peripheral keyboard 42. In addition, a wireless network interface card (WNIC) 24 may provide wireless communication that supports interactions with peripheral devices, such as peripheral keyboard 42.

In the example embodiment, a housing cover 28 fits over the base portion of housing 12 to cover the processing components and support an integrated keyboard on its upper surface. The keyboard has a keyboard circuit board 30 that detects inputs by keyboard keys 34 and reports the inputs to embedded controller 22, such as through communications by a keyboard controller 38. A thermal sensor 36 detects temperatures at keyboard circuit board 30 and provides the temperatures to keyboard controller 38. A plurality of electro-permanent magnet (EPM) components 44 are coupled on keyboard circuit board 30 and interfaced with keyboard controller 38, which adjusts magnetization of EPM components 44 between on and off states, such as to control bias of keyboard keys 34 between up and down states. In addition, keyboard controller 38 includes a de-magnetization protection logic stored in non-transitory memory that executes to control EPM component 44 on and off states based upon temperatures detected by thermal sensor 36. For instance, if a thermal state is detected that risks de-magnetization of EPM components 44, de-magnetization protection logic 40 commands EPM components 44 an off state until the thermal state is corrected. In one example embodiment, de-magnetization protection logic 40 may also command additional cooling to aid in reducing the thermal state, such as by communicating a request to embedded controller 22 for increased cooling airflow by cooling fan 46. In one alternative embodiment, de-magnetization protection logic 40 may execute on embedded controller 22. Although peripheral keyboard 42 is not depicted as an exploded view, it may include EPM components 44 as described with respect to the integrated keyboard.

Figure 2:
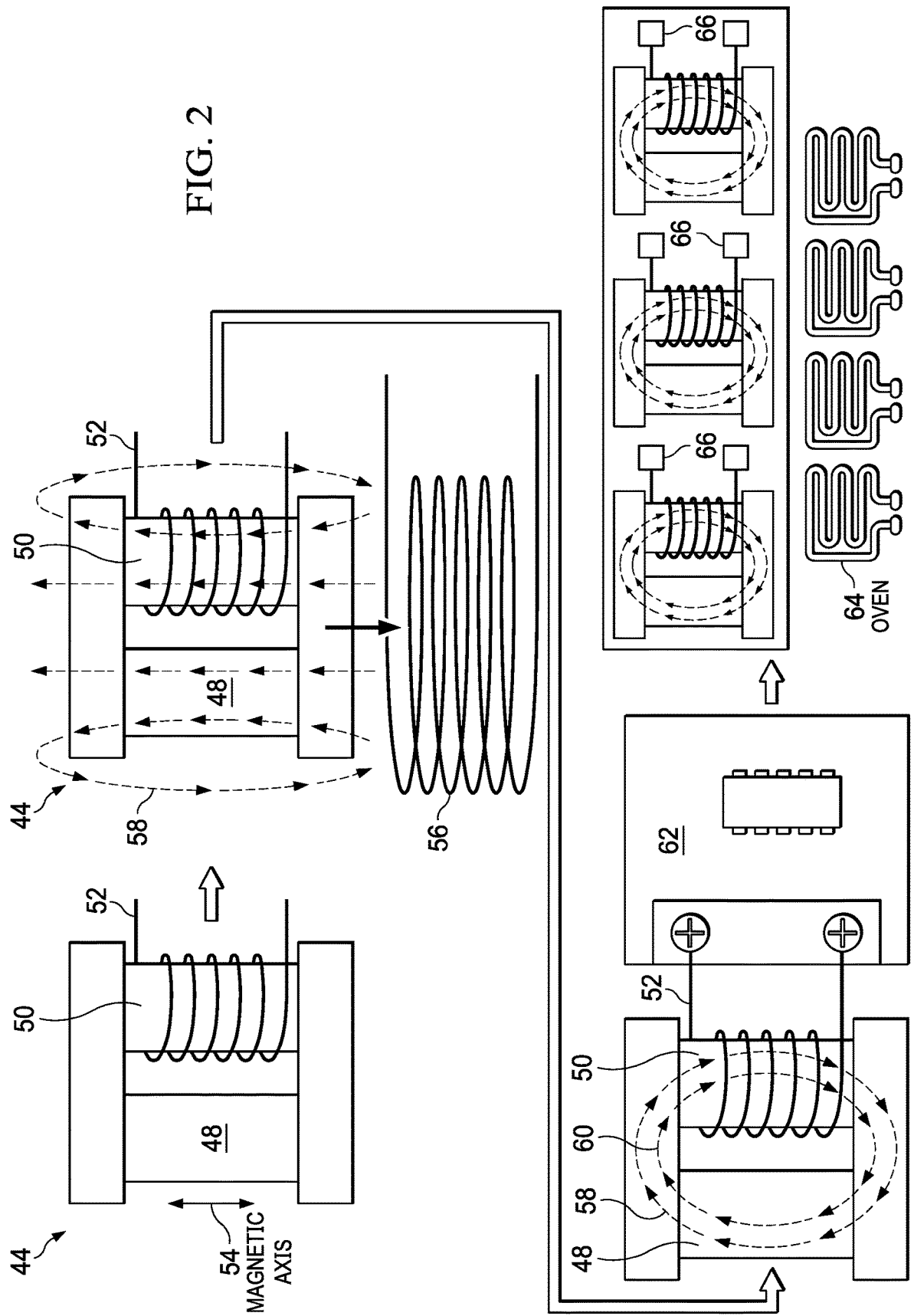
FIG. 2 depicts an example of manufacture of electro-permanent magnets with de-magnetization protection.

Referring now to FIG. 2, an example of manufacture of electro-permanent magnets with de-magnetization protection is depicted. Initially, an EPM component 44 is assembled by coupling a first magnet 48 next to a second magnet 50 with their magnetic axes 54 in a parallel relationship. Magnet 48 is, for example, a neodymium material. Magnet 50 is, for example, an alnico material and has a coil 52 of conductive wire disposed around it. Once magnets 48 and 50 are assembled in EPM component 44, EPM component 44 is inserted in a manufacture coil 56 and a current is applied to generate a magnet field that magnetizes both of magnets 48 and 50 to have a common polarity 58 in which the north/south axis are symmetrical so that EPM component 44 is in an on state. That is, in the on state with both of magnets 48 and 50 having first polarity 58 the combined magnetic attraction of both magnets operate to provide magnetic attraction. A difficulty with this on state is that the magnetic fields of both of magnets 48 and 50 are fighting each other to generate the combined magnetic attraction. In this on state, elevated temperatures can result in one stable magnetic field of one magnet de-magnetizing the other magnet. For instance, alnico tends to have a stable magnetic field at elevated thermal states compared to neodymium so that alnico magnet 50 can de-magnetize neodymium magnet 48.

In order to protect against de-magnetization, after magnetization by manufacture coil 56 EPM component 44 is interfaced with a polarity fixture 62 to apply a current that reverses the polarity of magnet 50 to a second polarity 60. When first magnet 48 has first polarity 58 and second magnet 50 has second polarity 60 of the opposite polarization, EPM component 44 is in an off state that has minimal if any external magnetic fields. In the off state, when an increased thermal state exists, the stable magnetic field of magnet 50 supports the magnetic field of first magnet 48 so that de-magnetization risk is reduced by preventing demagnetization until a higher thermal state relative to the on state. Once EPM component 44 is commanded to the off state by polarity fixture 62, EPM components may be pick and placed onto a circuit board with solder paste 66 and placed in an oven 64 that affixes EPM components 44 in place by application of heat without de-magnetization of magnet 48. After assembly of EPM components 44 is complete, the on and off states may be commanded within the thermal constraints defined to maintain stability of magnet 48 by applying current to coil 52 around magnet 50.

Figure 3:
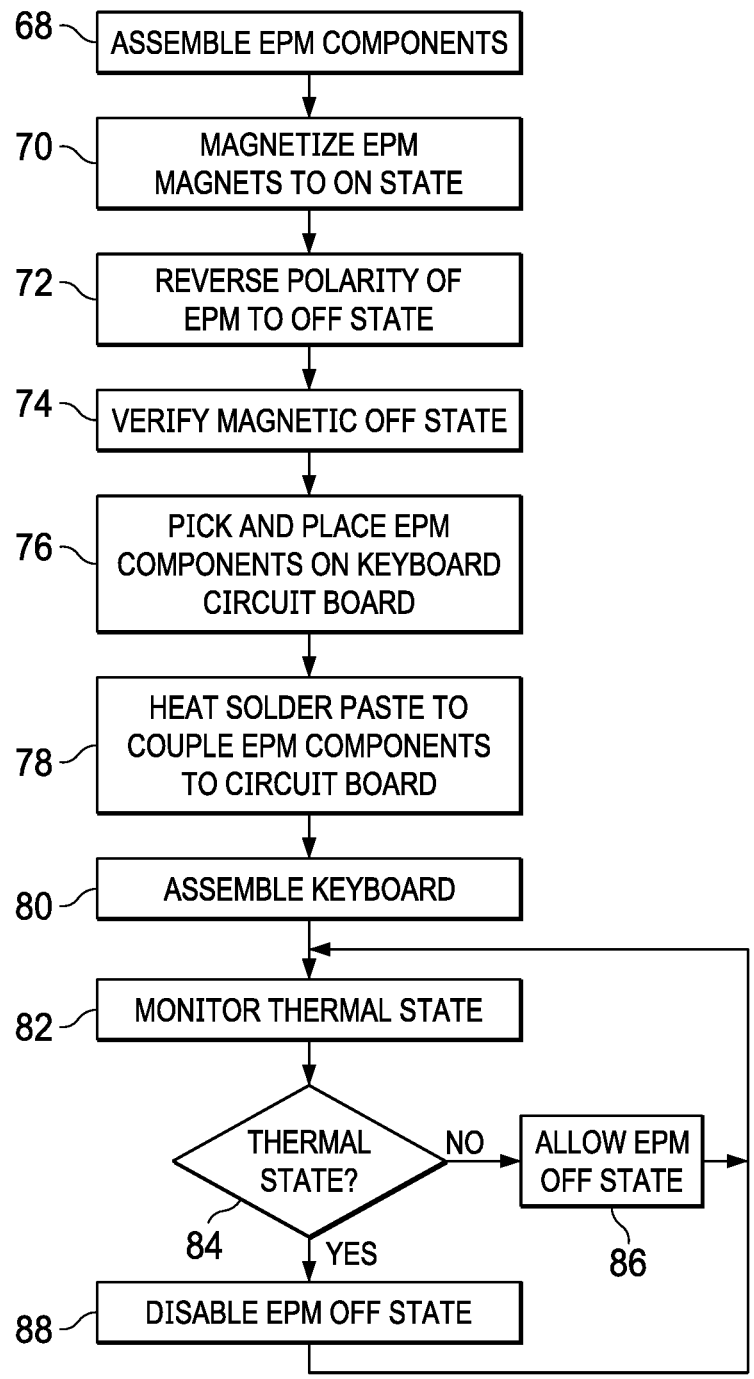
FIG. 3 depicts a flow diagram of a process for de-magnetization protection of electro-permanent magnets.

Referring now to FIG. 3, a flow diagram depicts a process for de-magnetization protection of electro-permanent magnets. The process starts at step 68 with assembly of EPM components using first and second magnets of different material, such as neodymium and alnico. At step 70, the EPM components are magnetized with a manufacture coil to have a common polarity in an on state. At step 72, the polarity of the second magnet is reversed by applying current to its coil so that the EPM component is in an off state having the magnets configured with opposing polarities. For example, the EPM component may be interfaced with a polarity fixture that applies a current. In one alternative embodiment, polarity may be reversed after pick and place by passing current through solder paste before heating. Once the polarity is reversed to place the EPM components in the off state, at step 74 the off state is confirmed, such as by measuring the magnetic field at the EPM component. Confirming the off state helps to ensure that an inadvertent de-magnetization will not occur once the EPM component is exposed to an increased thermal state.

At step 76 the EPM components are coupled to a circuit board, such as a circuit board for a keyboard, by a pick and place machine placement on solder paste. In alternative embodiments other types of component placements may be used, such as hand soldering. At step 78, the solder paste is heated, such as by placing the circuit board in an oven that couples the EPM component to the circuit board. With the EPM components in the off state, magnet stability against a higher thermal state is available than in the on state so that the risk of de-magnetization is reduced. At step 80 after the EPM components are coupled to the circuit board, the circuit board may be assembled into an information handling system or peripheral device, such as an integrated or peripheral keyboard. Within the information handling system or component, the EPM component operates between on and off magnetic states that changing the polarity of the second magnet. The operational process starts at step 82 with monitoring of the thermal state associated with the EPM component, such as a maximum operating temperature constraint. At step 84 a determination is made of whether the maximum thermal state is detected. If not, the process continues to step 86 to enable selection of the EPM off state at the system and returns to step 82 to continue monitoring the thermal state. If at step 84 the thermal state exceeds the thermal constraint, the process continues to step 88 to disable selection of the off state of the EPM component by the system. In addition, cooling may be commanded to reduce the thermal state at the EPM component and thereby reduce the amount of time that the EPM component is forced to stay in the off state.

Although the present invention has been described in detail, it should be understood that various changes, substitutions and alterations can be made hereto without departing from the spirit and scope of the invention as defined by the appended claims.

What is claimed is:

1. A method for protection of an electro-permanent magnet from de-magnetization, the method comprising:
determining a predetermined thermal state;
in response to the determining the predetermined thermal state, configuring the electro-permanent magnet to have only an off state having first and second magnets of the electro-permanent magnet configured to have opposing polarity;
maintaining the opposing polarity during the thermal state;
determining termination of the thermal state; and
in response to the determining termination of the thermal state, releasing the electro-permanent magnet to have either the on state or an off state having the first and second magnets configured to have aligned polarity.

2. The method of claim 1 wherein the electro-permanent magnet comprises:
the first magnet comprising neodymium having a first magnetic axis with a permanent polarity;
the second magnet comprising alnico having a second magnetic axis parallel to the first magnetic axis with a reversible polarity; and
a coil disposed at the second magnet and interfaced with a current source, the application of current from the current source to the coil reversing the second magnet polarity.

3. The method of claim 1 wherein:
the determining the predetermined state comprises disposing the electro-permanent magnet on a circuit board with solder paste for heating to couple the electro-permanent magnet to the circuit board; and
the determining termination of the thermal state comprises removing the circuit board from an oven after coupling the electro-permanent magnet to the circuit board with the solder paste.

4. The method of claim 3 wherein the circuit board comprises a keyboard having plural electro-permanent magnets arranged to coordinate key movement.

5. The method of claim 3 further comprising confirming the electro-permanent magnet off state before heating the circuit board to couple with the paste.

6. The method of claim 1 further comprising:
integrating the electro-permanent magnet into an information handling system housing;

monitoring thermal conditions in the information handling system housing to detect the predetermined thermal state.

7. The method of claim 6 wherein the electro-permanent magnets integrate in a keyboard of the information handling system.

8. The method of claim 7 further comprising:
detecting a threshold thermal state of less than the predetermined thermal state; and
in response to the detecting, applying active cooling towards the electro-permanent magnet.

9. The method of claim 8 wherein the active cooling comprises a cooling fan passing a cooling airflow proximate the electro-permanent magnet.

10. A method for manufacture of an information handling system, the method comprising:
assembling first and second magnets into an electro-permanent magnet component having a coil disposed around the second magnet;
placing the electro-permanent magnet in a manufacturing coil to simultaneously magnetize the first and second magnets with a common polarity;
applying current to the electro-permanent magnet coil to reverse the polarity of the second magnet so the electro-permanent magnet transitions from the common polarity to an opposing polarity;
placing the electro-permanent magnet on a circuit board with solder paste;
heating the circuit board to couple the electro-permanent magnet to the circuit board; and
assembling the circuit board into a keyboard.

11. The method of claim 10 wherein:
the first magnet comprises neodymium; and
the second magnet comprises alnico.

12. The method of claim 10 further comprising:
detecting a predetermined thermal condition of the keyboard; and
in response to detecting the predetermined thermal condition, commanding the electro-permanent magnet to an opposing polarity.

13. The method of claim 12 further comprising:
maintaining the electro-permanent magnet in the opposing polarity during the predetermined thermal condition; and
releasing the electro-permanent magnet to allow the common polarity when the predetermined thermal condition reverts.

14. The method of claim 12 further comprising initiating active cooling at the electro-permanent magnet in response to the predetermined thermal condition.

15. The method of claim 10 further comprising assembling the keyboard into a portable information handling system housing.

16. An information handling system keyboard comprising:
a circuit board having plural electro-permanent magnets;
a controller interfaced with the electro-permanent magnets;
a thermal sensor interfaced with the controller and operable to detect a predetermined thermal state; and
de-magnetization protection logic stored in non-transitory memory and operable when executed on the controller to command the electro-permanent magnets to an off state in response to the predetermined thermal state.

17. The information handling system keyboard of claim 16 further comprising an active cooling device, the de-magnetization logic when executed on the controller to command active cooling in response to the predetermined condition.

18. The information handling system of claim 17 wherein the circuit board couples into a portable information handling system housing.

19. The information handling system keyboard of claim 18 wherein each electro-permanent magnet comprises:
a neodymium magnet;
an alnico magnet; and
a coil disposed around the alnico magnet to accept a current that reverses the polarity of the alnico magnet.

20. The information handling system keyboard of claim 19 wherein the off state comprising opposing polarity of the neodymium and alnico magnets.

* * * * *